US006114943A

United States Patent [19]

Lauf

[11] Patent Number: 6,114,943

[45] Date of Patent: Sep. 5, 2000

[54] RESISTIVE HYDROGEN SENSING ELEMENT

[75] Inventor: Robert J. Lauf, Oak Ridge, Tenn.

[73] Assignee: Ut-Battelle, L.L.C., Oak Ridge, Tenn.

[21] Appl. No.: 09/320,387

[22] Filed: May 26, 1999

[51] Int. Cl.[7] .......... H01L 7/00

[52] U.S. Cl. .......... 338/34; 73/31.05

[58] Field of Search .......... 73/31.05, 31.06; 338/34, 35

[56] References Cited

U.S. PATENT DOCUMENTS

| | | | |
|---|---|---|---|
| 4,703,555 | 11/1987 | Hubner | 338/34 |
| 4,953,387 | 9/1990 | Johnson et al. | 338/34 |
| 5,017,340 | 5/1991 | Pribat et al. | 338/34 |
| 5,338,708 | 8/1994 | Felton . | |
| 5,367,283 | 11/1994 | Lauf et al. . | |
| 5,400,643 | 3/1995 | De Angelis et al. | 73/31.06 |
| 5,451,920 | 9/1995 | Hoffheins et al. . | |
| 5,652,443 | 7/1997 | Kasai | 338/34 |
| 5,918,261 | 6/1999 | Williams et al. | 338/34 |

*Primary Examiner*—Michael L. Gellner
*Assistant Examiner*—Karl Easthom
*Attorney, Agent, or Firm*—Wilson, Sonsini, Goodrich & Rosati

[57] ABSTRACT

Systems and methods are described for providing a hydrogen sensing element with a more robust exposed metallization by application of a discontinuous or porous overlay to hold the metallization firmly on the substrate. An apparatus includes: a substantially inert, electrically-insulating substrate; a first Pd containing metallization deposited upon the substrate and completely covered by a substantially hydrogen-impermeable layer so as to form a reference resistor on the substrate; a second Pd containing metallization deposited upon the substrate and at least a partially accessible to a gas to be tested, so as to form a hydrogen-sensing resistor; a protective structure disposed upon at least a portion of the second Pd containing metallization and at least a portion of the substrate to improve the attachment of the second Pd containing metallization to the substrate while allowing the gas to contact said the second Pd containing metallization; and a resistance bridge circuit coupled to both the first and second Pd containing metallizations. The circuit determines the difference in electrical resistance between the first and second Pd containing metallizations. The hydrogen concentration in the gas may be determined. The systems and methods provide advantages because adhesion is improved without adversely effecting measurement speed or sensitivity.

7 Claims, 6 Drawing Sheets

RESISTIVE HYDROGEN SENSING ELEMENT

STATEMENT AS TO RIGHTS TO INVENTIONS MADE UNDER FEDERALLY-SPONSORED RESEARCH AND DEVELOPMENT

This invention was made with United States government support awarded by the United States Department of Energy under contract No. DE-AC05-96OR22464 to Lockheed Martin Energy Research Corporation. The United States has certain rights in this invention.

BACKGROUND OF THE INVENTION

1. Field of the Invention

The invention relates generally to the field of monitoring the composition of gases and, more particularly, to solid state devices incorporating palladium (Pd) metal films, and methods relating thereto for measuring hydrogen concentration in a gas composition.

2. Discussion of the Related Art

Hydrogen sensors are useful for determining the relative amount of hydrogen in an atmosphere of interest. A typical hydrogen sensor functions based on the fact that the electrical properties of a number of palladium containing compositions vary as a function of their hydrogen content, the hydrogen content of the composition being in-turn a function of the partial pressure of hydrogen in the surrounding atmosphere. U.S. Pat. No. 5,338,708 to Felten, entitled "Palladium Thick-Film Conductor", describes compositions useful for hydrogen sensors.

U.S. Pat. No. 5,451,920 to Hoffheins et al. describes a thick film hydrogen sensor element which includes an essentially inert, electrically-insulating substrate having deposited thereon a thick film metallization forming at least two resistors. The metallization is a sintered composition of Pd and a sinterable binder such as glass frit. An essentially inert, electrically insulating, hydrogen impermeable passivation layer covers at least one of the resistors.

U.S. Pat. No. 5,367,283 to Lauf, et al. describes a thin film hydrogen sensor element which includes an essentially inert, electrically-insulating substrate; a thin-film metallization deposited on the substrate, the metallization forming at least two resistors on the substrate, the metallization including a layer of Pd or a Pd alloy for sensing hydrogen and an underlying intermediate metal layer for providing enhanced adhesion of the metallization to the substrate; and an essentially inert, electrically insulating, hydrogen impermeable passivation layer covering at least one of the resistors.

Referring to FIG. 1, a hydrogen sensor 10 made in accordance with U.S. Pat. Nos. 5,367,283 and 5,451,920 is shown. A nonconductive substrate 11 is provided with four conductive pads 12 deposited by thick-film metallization or other suitable technique. These pads 12 serve as a structure for interconnecting the sensor to measurement electronics, not shown. Four conductive metallizations 13, 14 of Pd or a Pd alloy are deposited between the pads 12 and form the four elements of a Wheatstone bridge circuit. Two of these conductive metallizations 13 are exposed to the surrounding atmosphere and the other two metallizations 14 are covered by a dense, hydrogen impermeable coating 15. When hydrogen is present in the gas surrounding hydrogen sensor 10, some hydrogen dissolves in the "active" metallizations 13 and their electrical resistance increases relative to that of the "reference" metallizations 14, which are prevented from absorbing hydrogen by the coating 15. The resistance increase in the "active" metallizations 13 causes an imbalance in a Wheatstone bridge circuit. The imbalance is directly related to the hydrogen concentration.

Previously disclosed hydrogen sensors are limited to certain ranges of hydrogen concentrations for optimal operation because of the well-known phenomenon that affects all Pd-based sensors at very high hydrogen concentrations, viz., the formation of a Pd hydride phase and the stresses associated with the corresponding volume change. In more detail, after exposure to high hydrogen concentrations, or repeated exposures to intermediate hydrogen concentrations, gradual delamination of the hydride forming "active" metallization from an underlying ceramic substrate can occur. This renders the sensor unreliable and can lead to total failure by open circuit of the associated Wheatstone bridge circuit. Making the metallization more adherent normally involves diminished sensitivity.

One previously proposed solution to this problem is to use a Pd alloy instead of pure Pd. However, the solubility of H in Pd alloys is lower than in pure Pd, and the electrical resistance of the alloy is higher than that of the pure metal. The inherent sensitivity of the resistive sensor is proportional to $\Delta R/R_0$, so with regard to a Pd alloy, these two effects (lower $\Delta R$, higher $R_0$) conspire to reduce the overall sensitivity of an alloy-based sensor relative to that of a pure Pd-based device.

Another previously proposed solution is to reformulate the paste used to form the metallizations 13 and 14 by increasing the proportion of glass frit and decreasing the proportion of Pd. It can be appreciated that this approach will have the same drawbacks (lower $\Delta R$, higher $R_0$) as discussed in the previous case of alloying.

Heretofore, the requirements of reduced delamination and breakage without reduced sensitivity have not been fully met. What is needed is a solution that addresses all of these requirements simultaneously. The invention is directed to meeting these requirement, among others.

SUMMARY OF THE INVENTION

A primary goal of the invention is the provision of a hydrogen sensor that is more robust, and particularly resistant to damage or delamination of the Pd metallization in the presence of high concentrations of hydrogen in the gas to be tested. Another goal of this invention is to provide a method of making a hydrogen sensor that can withstand high concentrations of hydrogen without failure. Another goal of this invention is to make a resistive hydrogen sensor that can withstand repeated exposures to intermediate concentrations of hydrogen without failure. Another goal of this invention is to make a resistive hydrogen sensor in which the active metallization can be optimized for sensitivity to hydrogen. Another goal of the invention is the provision of a hydrogen sensor that can be manufactured with minimal added cost or processing steps compared to previous sensors.

According to one aspect of the invention, an apparatus includes: a substantially inert, electrically-insulating substrate; a first Pd containing metallization deposited on the substrate and substantially covered by a substantially hydrogen-impermeable layer, thereby forming a reference resistor on the substrate; a second Pd containing metallization deposited on the substrate and at least partially exposed to a gas to be tested, thereby forming a hydrogen-sensing resistor on the substrate, the second metallization; a protective material disposed upon at least a portion of the second Pd containing metallization and at least a portion of the substrate to improve the attachment of the second Pd containing metallization to the substrate while allowing the gas to contact the second Pd containing metallization; and a resistance bridge circuit coupled to both the first Pd containing metallization, and the second Pd containing metallization, the resistance bridge circuit determining the difference in electrical resistance between the first and second Pd containing metallizations, whereby a hydrogen concentration in the gas may be determined.

In accordance with another aspect of the invention, a structure is provided for covering the active metallization in a hydrogen sensor with a strongly adherent layer that defines a pattern.

In accordance with another aspect of the invention, a structure is provided for securely affixing the active metallization in a hydrogen sensor to the substrate at selected points while substantially preserving the accessibility of the metallization to ambient hydrogen.

In accordance with another aspect of the invention, a structure is provided for completely covering the active metallization in a hydrogen sensor with a strongly adherent layer that is, at the same time, porous or permeable to hydrogen.

In accordance with another aspect of the invention, a method of fabricating a hydrogen sensing element includes: depositing a Pd containing metallization on a substantially inert, electrically-insulating substrate; covering a first portion of said Pd containing metallization to form a reference resistor on said substrate; and forming a protective structure on a second portion of said Pd containing metallization to form a hydrogen-sensing resistor.

In accordance with another of aspect of the invention, a method is provided for forming first and second Pd containing metallization on a substrate; and then forming a protective structure on top of at least a portion of the second Pd containing metallization to improve the adhesion of the second Pd containing metallization to the substrate.

These, and other, goals and aspects of the invention will be better appreciated and understood when considered in conjunction with the following description and the accompanying drawings. It should be understood, however, that the following description, while indicating preferred embodiments of the invention and numerous specific details thereof, is given by way of illustration and not of limitation. Many changes and modifications may be made within the scope of the invention without departing from the spirit thereof, and the invention includes all such modifications.

BRIEF DESCRIPTION OF THE DRAWINGS

A clear conception of the advantages and features constituting the invention, and of the components and operation of model systems provided with the invention, will become more readily apparent by referring to the exemplary, and therefore nonlimiting, embodiments illustrated in the drawings accompanying and forming a part of this specification, wherein like reference characters designate the same parts. It should be noted that the features illustrated in the drawings are not necessarily drawn to scale.

DESCRIPTION OF PREFERRED EMBODIMENTS

The invention and the various features and advantageous details thereof are explained more fully with reference to the nonlimiting embodiments that are illustrated in the accompanying drawings and detailed in the following description of preferred embodiments. Descriptions of well known components and processing techniques are omitted so as not to unnecessarily obscure the invention in detail. The entire contents of U.S. Pat. Nos. 5,338,708; 5,367,283, and 5,451,920 are hereby expressly incorporated by reference into the present application as if fully set forth herein.

Figure 1:
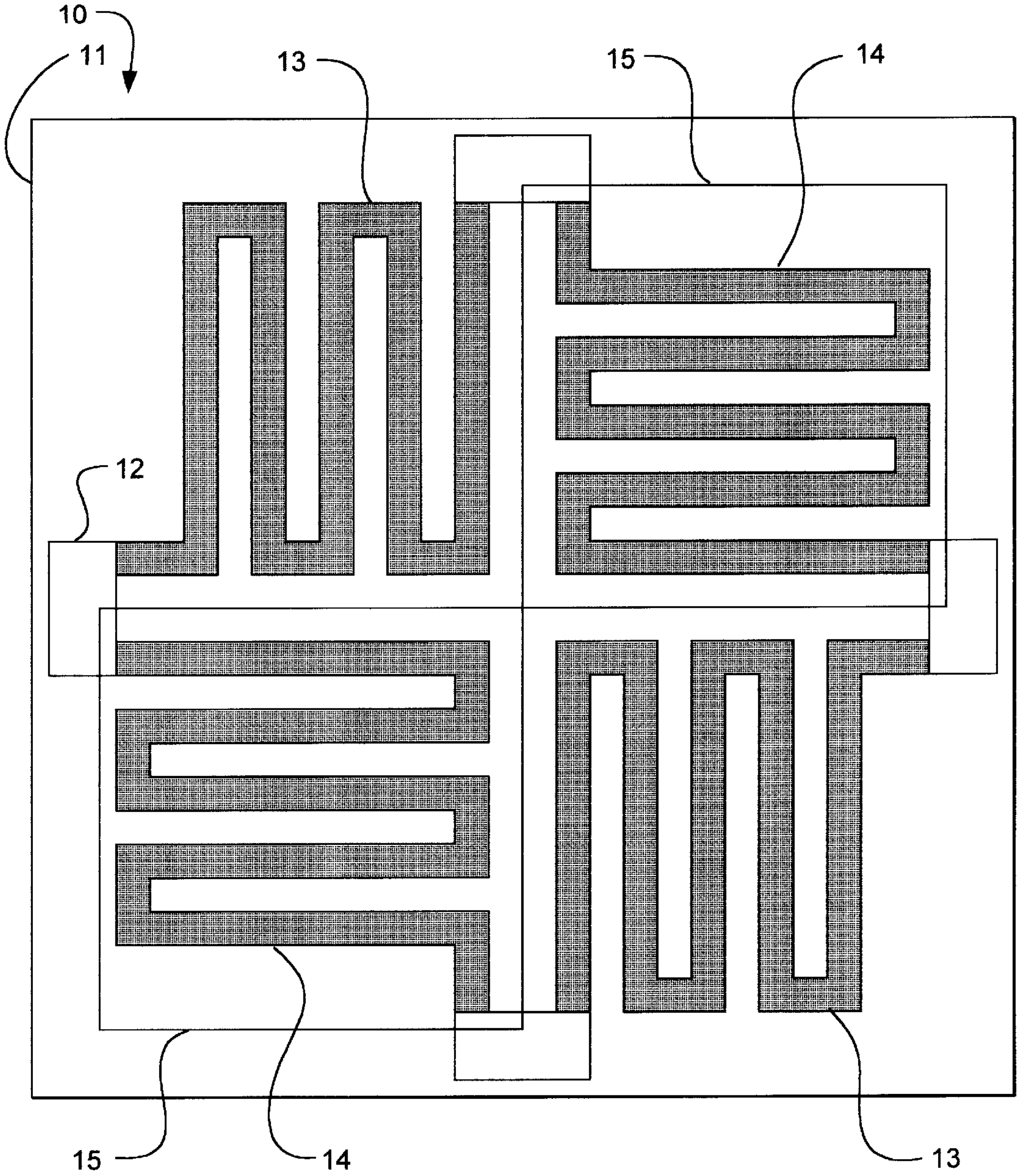
FIG. 1 PRIOR ART
FIG. 1 is a schematic plan view showing the layout of a resistive hydrogen sensing element in accordance with U.S. Pat. No. 5,451,920 (appropriately labeled Prior Art).

Referring again to FIG. 1, deleterious effects were observed when the sensor 10 was exposed to high concentrations of hydrogen as well as when the sensor 10 was repeatedly exposed to intermediate concentrations of hydrogen. Specifically, the "active" metallizations 13 delaminate from the substrate 11, ultimately breaking apart in some instances. As shown in FIG. 1, the metallizations 13, 14 are generally deposited in a serpentine pattern to maximize total resistance and minimize bridge current. The delamination often began at the serpentine turns where the "active" metallizations 13 reverse direction. The problem may be attributed to the formation of a Pd hydride phase and the accompanying volume expansion, which created stresses in the metallization.

This effect has been partially mitigated in the past by two approaches. First, in a thick-film process the Pd resistor composition can be formulated with more glass frit and less Pd. Second, in a thick- or thin-film process a Pd alloy can be used instead of pure Pd. Either of these approaches has a significant disadvantage in that measurement sensitivity is diminished.

The invention is directed to a discontinuous or porous structure that overlays the ambient exposed metallization of a hydrogen sensor to improve adhesion of the ambient exposed metallization to the substrate without adversely affecting the accessibility of this metallization to ambient hydrogen. The invention improves robustness, particularly with respect to deformation/delamination of the exposed metallization in the presence of high ambient hydrogen levels and/or repeated cycling between high and low hydrogen concentrations, with little or no trade-off in measurement speed or sensitivity.

Referring now to FIGS. 2A–5, a discontinuous or continuous porous layer is applied over the top of the active metallization to affix it more securely to the substrate at selected points while maintaining the accessibility of this metallization to ambient gases. In several examples, the new layer is preferably the same material as that of the existing passivation layer, so that no additional processing steps or materials are needed. This approach merely changes the maskworks to add this feature when applying the existing passivation layer. However, it will be understood that a wide variety of suitable materials either the same as, or different from, the passivation layer may be used in conjunction with the invention under particular circumstances.

The invention can be applied equally well to both thin- and thick-film versions of hydrogen sensors. The invention can also be applied to non-palladium containing sensors, or even non-sensors that can be improved by such a protective structure.

The particular manufacturing process used for forming the protective structure should be inexpensive and reproducible. Conveniently, the protective structure of the invention can be formed by using any film forming method. It is preferred that the process be a thin-film deposition technique such as sputter evaporation, or chemical or physical vapor deposition with photo masks or, alternatively, for a thick-film deposition technique that deposits a protective structure precursor material as a paste or ink such as printing through a mask, direct writing by a numerically driven ink jet, or squeegeeing with a doctor blade. Any of these techniques can be used in conjunction with lithographic techniques, with or without an additional photo resist layer to form specific patterns in the protective structure. In addition, any of these techniques can be used in combination with trimable resistors. For the manufacturing operation, it is an advantage to employ a reproducible technique.

However, the particular manufacturing process used for forming the protective structure is not essential to the invention as long as it provides the described functionality. Normally those who make or use the invention will select the manufacturing process based upon tooling and energy requirements, the expected application requirements of the final product, and the demands of the overall manufacturing process.

The particular material used for the protective structure should be strong and chemically stable. Conveniently, the protective structure of the invention can be made of any hydrogen compatible material. For the manufacturing operation, it is an advantage to employ the same material that is used to form the passivation structure.

However, the particular material selected for protective structure is not essential to the invention, as long as it provides the described function. Normally, those who make or use the invention will select the best commercially available material based upon the economics of cost and availability, the expected application requirements of the final product, and the demands of the overall manufacturing process.

Most of the disclosed embodiments show a porous or perforated film as the structure for performing the function of protecting and enhancing adhesion, but the structure for protecting and enhancing adhesion can be any other structure capable of performing the function of improving adhesion, including, by way of example a series of structural members, or even amalgamated granules.

While not being limited to any particular performance indicator or diagnostic identifier, preferred embodiments of the invention can be identified one at a time by testing for the presence of enhanced adhesion. The test for the presence of enhanced adhesion can be carried out without undue experimentation by the use of a simple and conventional hydrogen cycling experiment. Another way to seek embodiments having the attribute of enhanced adhesion is to test for the presence of stress and/or stain in the protective structure and/or the Pd containing material.

The term coupled, as used herein, is defined as connected, although not necessarily directly, and not necessarily mechanically. The phrase thin-film, as used herein, is defined as a layer of material having a thickness of less than or equal to approximately 5 microns, preferably less than 1 micron. The phrase thick-film, as used herein, is defined as a layer of material having a thickness greater than or equal to approximately 5 microns, preferably greater than approximately 10 microns. The term substantially, as used herein, is defined as approximately (e.g., preferably within 10% of, more preferably within 1% of, most preferably within 0.1% of).

EXAMPLES

Specific embodiments of the invention will now be further described by the following, nonlimiting examples which will serve to illustrate in some detail various features of significance. The examples are intended merely to facilitate an understanding of ways in which the invention may be practiced and to further enable those of skill in the art to practice the invention. Accordingly, the examples should not be construed as limiting the scope of the invention.

Example 1

Figure 2A:
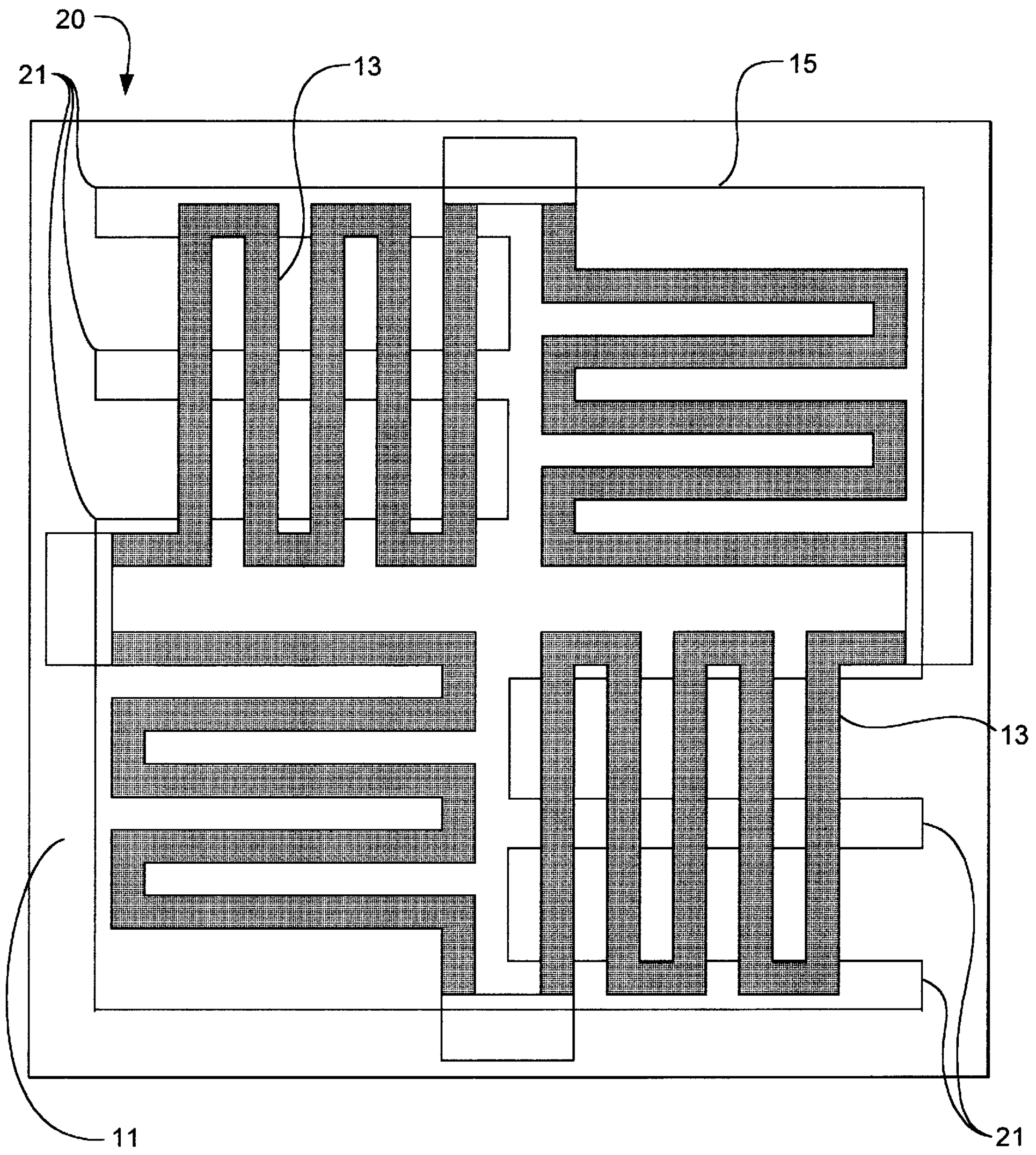
FIG. 2A is a schematic plan view showing the layout of a resistive hydrogen sensing element in which the passivation coating covering the reference metallization is extended to cover selected portions of the active metallization, representing an embodiment of the invention.

Referring to FIG. 2A, sensor 20 has a passivation layer 15' that includes narrow strips 21 that extend across the active metallizations 13, covering these metallizations only at selected points (in particular the bend areas where failures tend to occur). The narrow strips in FIG. 2A are physically contiguous with the passivation layer 15. Thus, the metallizations 13 are held much more securely to the substrate 11 while still presenting most of their surface area to the surrounding gas.

FIG. 2A shows a design in which the added feature comprises lines extending perpendicular to the existing active metallizations, whereby the active metallization is securely pinned to the substrate at the intersection points. Ideally, two of these lines should be positioned to cover the corners or turns of the serpentine metallization paths as shown, because it has been observed that delaminations frequently start at this location.

Example 2

Figure 2B:
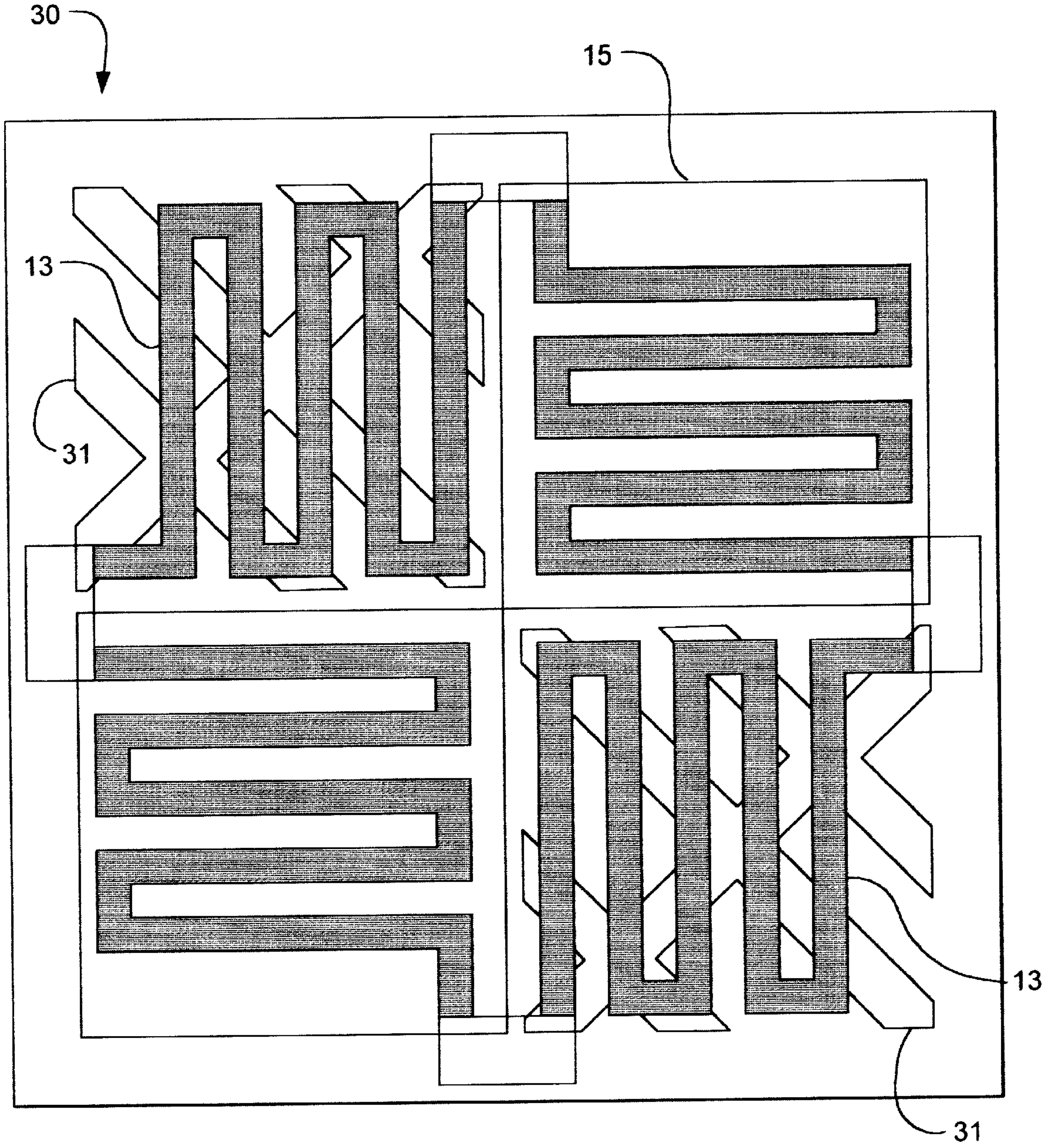
FIG. 2B is a schematic plan view showing the layout of a resistive hydrogen sensing element in which a protective dielectric structure is deposited in a lattice pattern to cover selected portions of the active metallization, representing an embodiment of the invention.

FIG. 2B shows a sensor 30 with a protective structure that is not physically contiguous with the passivation layer. The passivation layers 15 in FIG. 2B are the same general shape as in FIG. 1. In the example shown in FIG. 2B, the protective structure is deposited in a lattice-work pattern 31, which criss-crosses the active metallizations 13. Again, the effect is to improve adhesion of the metallizations 13 without excluding hydrogen from contacting the mealizations 13. This example illustrates another aspect of the invention, viz., that the lattice-work pattern 31 does not need to be physically contiguous with the passivation layer 15 nor does it need to be made from the same material. However, the lattice-work pattern 31 is preferably made from the same material as the passivation layer 15, so that the lattice-work pattern 31 can be incorporated simply by modifying the maskwork that defines the pattern of the passivation layer 15.

Referring to both FIGS. 2A and 2B it can be appreciated that the fractional area of the active metallization 13 covered by the protective features 21 or 31 is preferably kept as small as possible in order to maximize the area of 13 that remains exposed. It will also be noted that in the designs shown in the preceding examples, hydrogen can diffuse laterally along the metallizations 13, thereby giving some accessability even to the areas crossed-over by the protective feature 21 or 31. For comparison, the passivation layer 15 most preferably covers the entire reference metallization 14, including its edges, to prevent hydrogen from entering the reference metallization by lateral diffusion.

Example 3

Figure 3A:
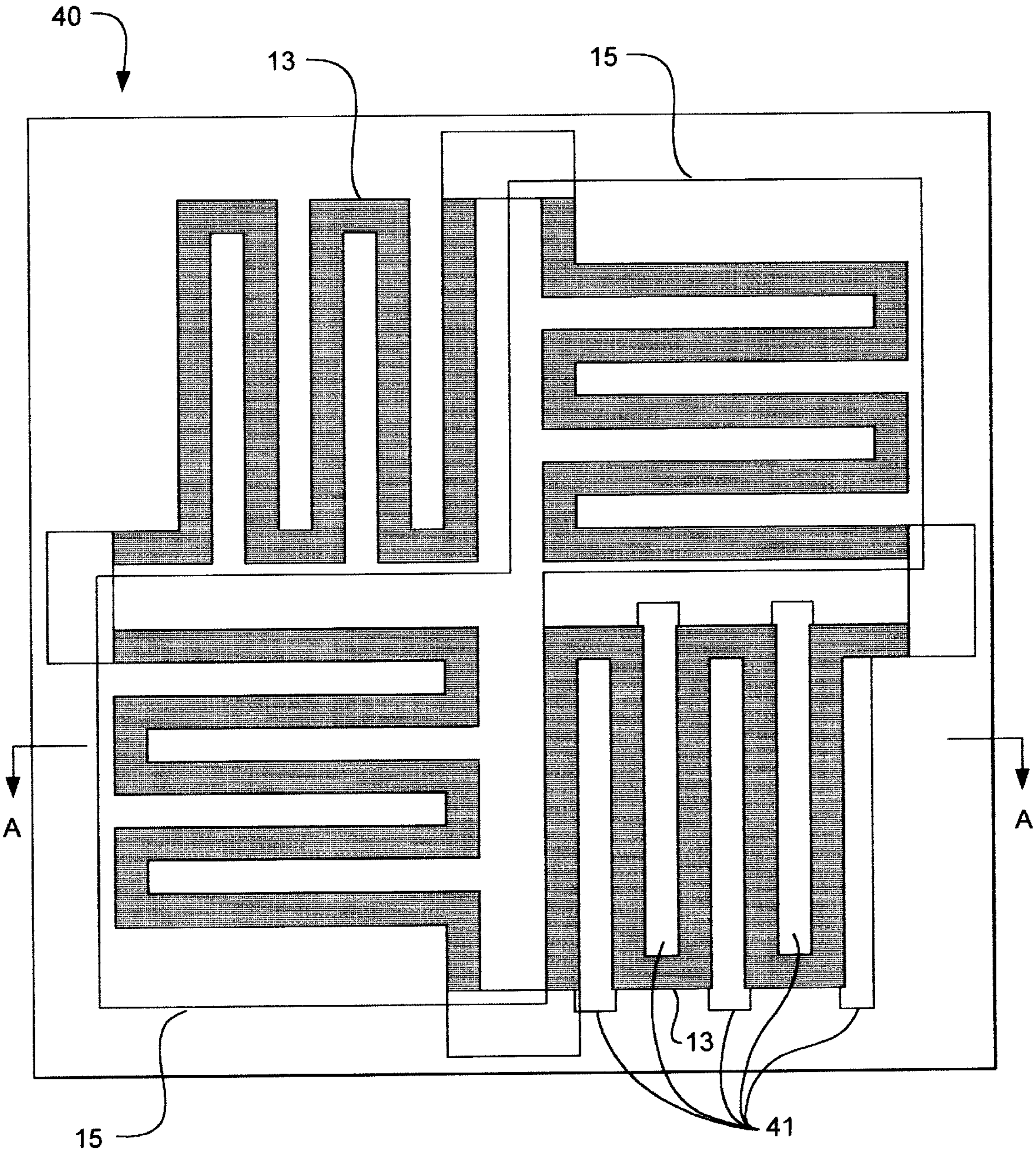
FIG. 3A is a schematic plan view showing the layout of a resistive hydrogen sensing element in which a protective dielectric structure is deposited in a pattern substantially parallel to the active metallization to cover predominantly the edge portions of the active metallization, representing an embodiment of the invention.
Figure 3B:
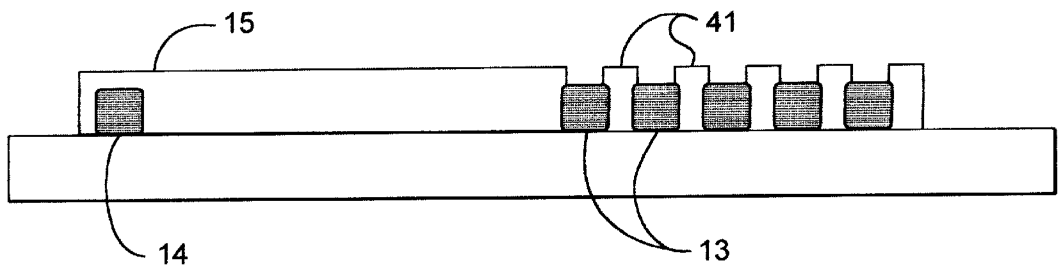
FIG. 3B is a cross-sectional view through A—A in FIG. 3A, showing in more detail the relative arrangements of the various features of the sensing element.

FIG. 3A shows a plan view of a sensor 40 in which the protective structure comprises strips 41 that are parallel to the existing active resistor lines and partially overlap them, while leaving most of the active area exposed to the ambient gases. FIG. 3B shows a detail of this structure in cross-section, whereby it can be appreciated that the strips 41 will greatly improve the adhesion of the active metallization 13 without significantly affecting its sensitivity to hydrogen. Again, this structure can easily be made at the same time as the existing passivation layer 15 using the same materials and modified maskworks.

In this example sensor 40 includes protective strips 41 that are disposed substantially parallel to the lines of the active metallization 13. The strips 41 overlap the metallization 13 along its edges as shown in Section A—A of FIG. 3B, but do not completely cross over the metallization 13 at any point. (For comparison, note how the reference metallization 14 is completely covered by the passivation layer 15.) In the particular example illustrated in FIGS. 3A–3B, the active metallization in the upper left-hand comer has not been provided with a protective structure. However, this is merely to show that not every active metallization must be associated with a protective structure, and the active metallization in the upper left-hand corner of FIG. 3A could easily be provided with a protective structure.

As in the previous examples, for manufacturing simplicity the protective structure is preferably the same material as the passivation layer 15, but it does not need to be.

It will be appreciated that the designs illustrated in the preceding examples lend themselves equally well to both thick-film and thin-film fabrication methods. These thick-film and thin-film fabrication methods can be based on combined maskwork that includes both the passivation layer and protective structure configurations, or separate maskwork that embodies the passivation layer and protective structured geometries. It will be further understood that the term maskwork as used herein includes photomasks, patterned photoresist, thick-film printing screens and their corresponding artwork, and any other suitable means for depositing a layer of material in a selected pattern upon a substrate, such as direct writing from a CAD representation of the pattern.

Example 4

Figure 4A:
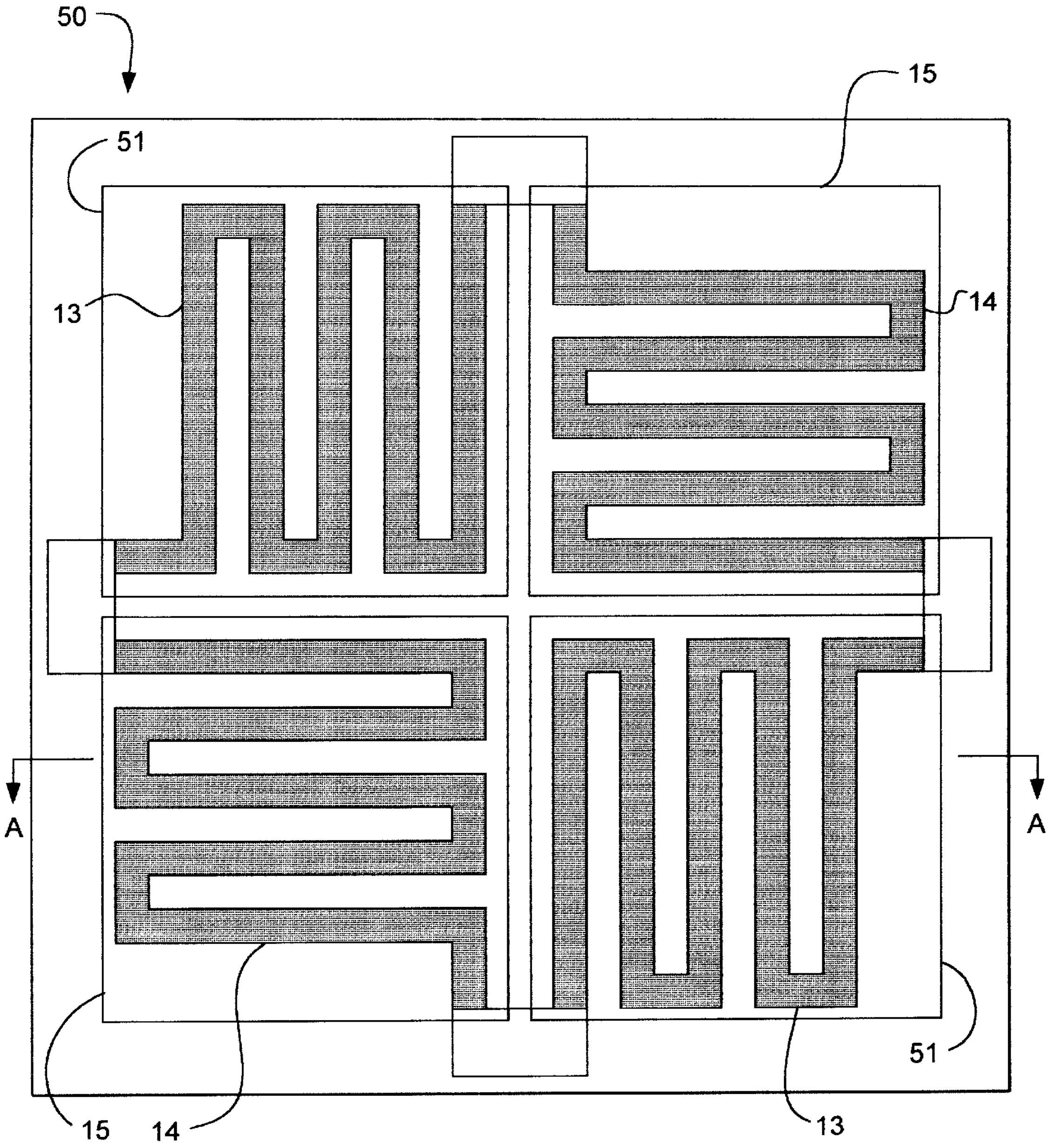
FIG. 4A is a schematic plan view showing the layout of a resistive hydrogen sensing element in which a protective dielectric structure is deposited in a substantially continuous yet hydrogen permeable layer covering the active metallization while a continuous but hydrogen impermeable layer covers the reference metallization, representing an embodiment of the invention.
Figure 4B:
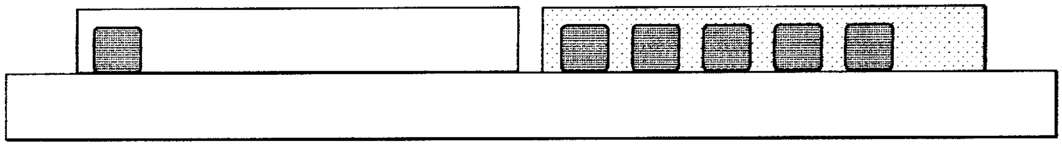
FIG. 4B is a cross-sectional view through A—A in FIG. 4A, showing in more detail the relative arrangements of the various features of the sensing element.

FIGS. 4A–4B show another example, in which the entire area of the active metallization 13 is covered with a strong yet porous or gas-permeable layer 51. This design would provide maximal robustness but at some cost in terms of measurement speed or response time, owing to the time needed for hydrogen to diffuse through the permeable layer. In this example, the material of the layer 51 would need to be different from that of the passivation layer 15 and would have to be applied separately, although in the case of a thick-film process the two layers could be formulated so that they can be fired at the same time.

In this example, sensor 50 includes both the active metallizations 13 and the reference metallizations 14 covered by substantially continuous layers, but these substantially continuous layers are of two different materials. The passivation 15 covering the reference metallization 14 is dense and impermeable to hydrogen as in the previous examples. However, while the protective structure 51 is strong and adherent to the substrate 11, it must be porous or permeable to hydrogen gas (for example, through interconnected porosity). Because the material of layer 51 is not the same as that of layer 15, these two structures may be deposited separately from one another. It would be possible, using conventional thick-film techniques, to deposit these patterns separately but fire them at the same time through proper formulation of the materials.

Example 5

Figure 5:
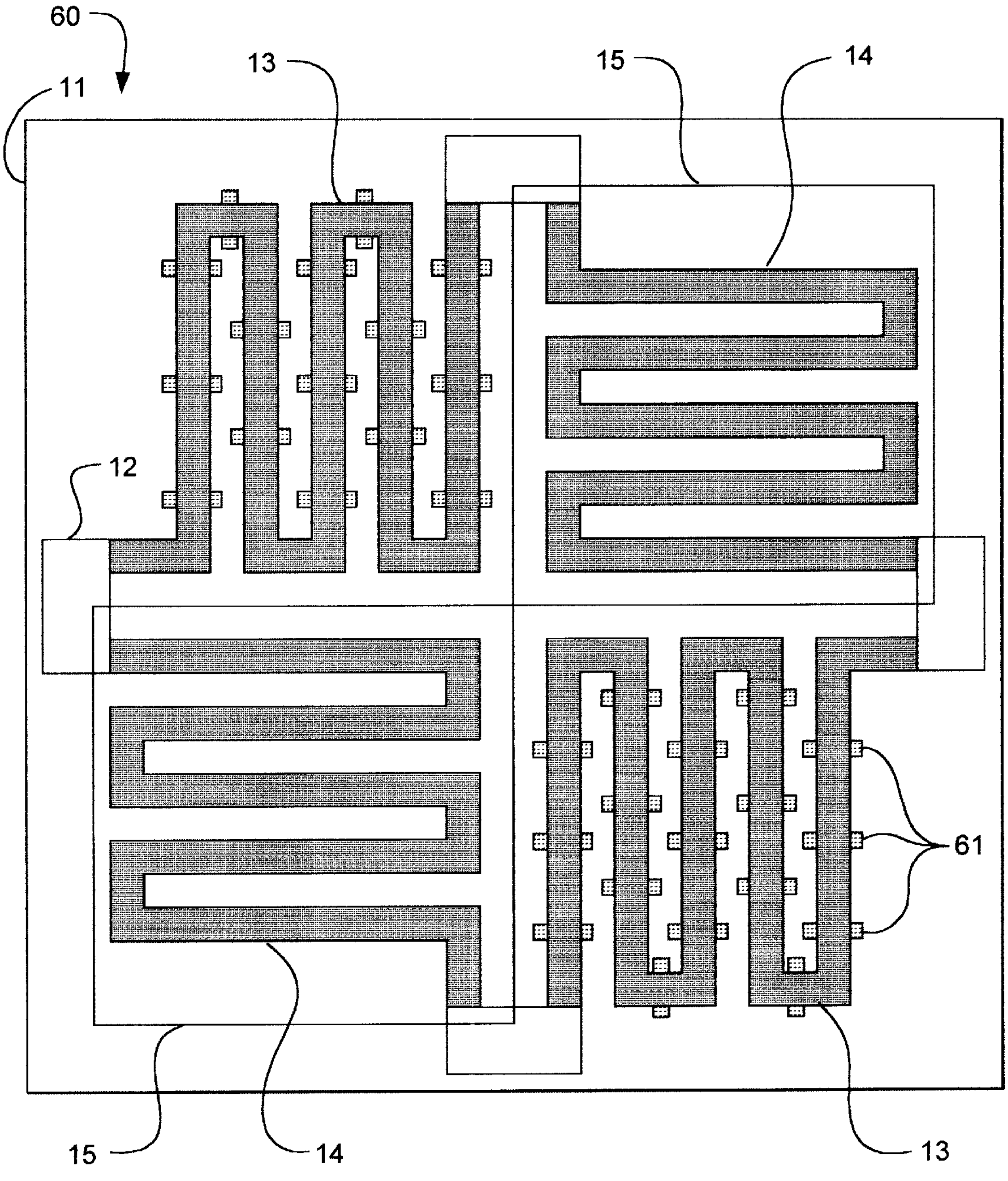
FIG. 5 is a schematic plan view of a sensing element in accordance with another aspect of the present invention, in which the protective structure is a resistor or a conductor rather than a dielectric, representing an embodiment of the invention.

FIG. 5 shows another embodiment, in which the plurality of pads 61 are placed along the length of each active metallization 13. The pads 61 in this example can be constructed of a dielectric material, a resistive material, or even a conductor. The pads 61 cross each active metallization 13 at only one point of the serpentine pattern to avoid creating a parallel conductive path or a short circuit.

In the preceding examples, it was assumed that the protective structure is composed of a dielectric material with an electrical resistivity that is very high compared to that of the Pd metallizations, in order to avoid creating either a short circuit between the individual conductor lines or a parallel parasitic conductive path that would diminish sensitivity. However, as shown in FIG. 5, it is possible to construct a sensor in which the protective feature is a resistor or a conductor rather than a dielectric. It will be seen that for this situation, the protective pads 61 are deposited as a series of brackets, each of which crosses a given active metallization 13 at only one point, thereby avoiding a short-circuit between two metallization lines. Further, the pad 61 are fairly narrow to minimize the length of the line 13 that is affected by parasitic current flowing through the structure 61 in parallel with the current flowing through the conductor 13. Suitable materials for the pads 61 include thick-film conductors such as Au, Ag, Pt, and Ag—Pd based compositions as well as thick-film resistor compositions as are well known in the art.

Comparing FIGS. 2A–5 one can appreciate the general concept of Applicant's invention, i.e., the incorporation of a protective structure serving to more securely bind the active metallization 13 to the substrate 11 while still admitting the ambient gases through one or more openings. In Examples 1–3 and 5 these openings are macroscopic, whereas in Example 4 the openings are microscopic but correspondingly more numerous.

The invention can be adapted to either thin-film or thick-film hydrogen sensors. Skilled artisans will appreciate that the inventive structures could be applied also to the active metallization in a two-sided hydrogen sensor configuration. In general, the invention can be applied to all previously disclosed resistive hydrogen sensor designs without diminishing their originally reported positive attributes.

Similarly, the inventive improvements can be combined with other known features of previously disclosed resistive hydrogen sensors, such as the use of a heater to "bake out" the sensor periodically to remove contamination, moisture, etc. It will also be understood that sensors having the inventive improvements may be incorporated directly into similar measurement circuits, detectors, alarms, and other electronic devices and systems for which the previously disclosed sensors are suitable.

Advantages of the Invention

A hydrogen sensor, representing an embodiment of the invention, can be cost effective and advantageous for at least the following reasons. The invention provides improved robustness, particularly at high hydrogen concentrations, with little or no trade-off in measurement speed or sensitivity. The invention permits the use of less-adherent but more sensitive formulations for the active metallization.

The invention can be used with either thick-film or thin-film designs. In most cases, there are no added process steps or costs. The adoption of the invention requires only simple modification of existing maskworks.

All the disclosed embodiments of the invention described herein can be realized and practiced without undue experimentation. Although the best mode of carrying out the invention contemplated by the inventors is disclosed above, practice of the invention is not limited thereto. Accordingly, it will be appreciated by those skilled in the art that the invention may be practiced otherwise than as specifically described herein.

For example, the individual components need not be formed in the disclosed shapes, or assembled in the disclosed configuration, but could be provided in virtually any shape, and assembled in virtually any configuration. Further, the individual components need not be fabricated from the disclosed materials, but could be fabricated from virtually any suitable materials. Further, although the hydrogen sensor described herein can be a physically separate module, it will be manifest that the hydrogen sensor may be integrated into the apparatus with which it is associated. Furthermore, all the disclosed elements and features of each disclosed embodiment can be combined with, or substituted for, the disclosed elements and features of every other disclosed embodiment except where such elements or features are mutually exclusive.

It will be manifest that various additions, modifications and rearrangements of the features of the invention may be made without deviating from the spirit and scope of the underlying inventive concept. It is intended that the scope of the invention as defined by the appended claims and their equivalents cover all such additions, modifications, and rearrangements. The appended claims are not to be interpreted as including means-plus-function limitations, unless such a limitation is explicitly recited in a given claim using the phrase "means-for." Expedient embodiments of the invention are differentiated by the appended subclaims.

What is claimed is:

1. An apparatus, comprising:

a substantially inert, electrically-insulating substrate;

a first Pd containing thin film metallization deposited upon said substrate and substantially covered by a substantially hydrogen-impermeable layer, thereby forming a reference resistor on said substrate;

a second Pd containing thin film metallization deposited upon said substrate and at least a partially accessible to a gas to be tested, thereby forming a hydrogen-sensing resistor on said substrate;

a protective structure disposed upon at least a portion of said second Pd containing metallization and at least a portion of said substrate to improve the attachment of said second Pd containing metallization to said substrate while allowing said gas to contact said second Pd containing metallization, wherein said substantially hydrogen impermeable layer and said protective structure compose a substantially dense dielectric material deposited upon said sensor in a single operation through a common maskwork; and a resistance bridge circuit coupled to both said first Pd containing metallization and said second Pd containing metallization, said resistance bridge circuit determining the difference in electrical resistance between said first Pd containing metallization and said second Pd containing metallization, whereby a hydrogen concentration in said gas may be determined.

2. An apparatus in accordance with claim 1, wherein said first Pd containing metallization and said second Pd containing metallization form at least part of a Wheatstone resistance bridge circuit.

3. An apparatus in accordance with claim 1, wherein both said first Pd containing metallization and said second Pd containing metallization include a Pd alloy.

4. An apparatus, comprising:

a substantially inert, eclectically-insulating substrate;

a first Pd containing metallization deposited upon said substrate and substantially covered by a substantially hydrogen-impermeable layer, thereby forming a reference resistor on said substrate;

a second Pd containing metallization deposited upon said substrate and at least a partially accessible to a gas to be tested, thereby forming a hydrogen-sensing resistor on said substrate;

a protective structure disposed upon at least a portion of said second Pd containing metallization and at least a portion of said substrate to improve the attachment of said second Pd containing metallization to said substrate while allowing said gas to contact said second Pd containing metallization; and a resistance bridge circuit coupled to both said first Pd containing metallization and said second Pd containing metallization, said resistance bridge circuit determining the difference in electrical resistance between said first Pd containing metallization and said second Pd containing metallization, whereby a hydrogen concentration in said gas may be determined, wherein said substantially hydrogen impermeable layer and said protective structure composes a substantially dense dielectric material deposited in a single operation through a common network.

5. A hydrogen sensor, comprising:

a substantially inert, electrically-insulating substrate;

a first thick film metallization deposited on said substrate, said first thick film metallization forming a resistor on said substrate, said first thick film metallization including a sintered composition of Pd and a sinterable binder, said metallization deposited upon said substrate and completely covered by a substantially hydrogen-impermeable layer, thereby forming a reference resistor on said substrate;

a second thick film metallization deposited on said substrate, said second thick film metallization forming a resistor on said substrate, said second thick film metallization including said sintered composition of Pd and said sinterable binder, said second thick film metallization at least partially accessible to a gas to be tested, thereby forming a hydrogen-sensing resistor on said substrate;

a protective structure disposed upon at least a portion of said second metallization and at least a portion of said substrate thereby improving the attachment of said second metallization to said substrate at selected places along its surface while allowing said gas to contact said second metallization in other selected places, wherein said substantially hydrogen-impermeable layer and said protective structure compose a thick-film dielectric material deposited upon said hydrogen sensor in a single operation through a common maskwork; and a resistance bridge circuit coupled to both said reference resistor and said hydrogen-sensing resistor, said resistance bridge circuit determining the difference in electrical resistance between said first and second metallizations, whereby the hydrogen concentration in said gas may be determined.

6. A hydrogen sensor in accordance with claim 5, wherein both said first thick film metallization and said second thick film metallization include a Pd alloy.

7. A resistive hydrogen sensor, comprising:

a substantially inert, electrically-insulating substrate;

a first Pd containing metallization deposited upon said substrate and completely covered by a hydrogen-impermeable layer, thereby forming a reference resistor on said substrate;

a second Pd containing metallization deposited upon said substrate and at least partially accessible to a gas to be tested, thereby forming a hydrogen-sensing resistor;

a substantially continuous protective structure disposed upon said second metallization and said substrate thereby improving the attachment of said metallization to said substrate, said protective structure containing interconnected porosity, whereby said gas may contact said metallization in selected places;

a resistance bridge circuit coupled to both said reference resistor and said hydrogen-sensing resistor, said resistance bridge circuit determining the difference in electrical resistance between said first and second metallizations, whereby the hydrogen concentration in said gas may be determined; and wherein said hydrogen-impermeable layer and said protective structure are separately deposited as thick films and then co-fired in a single sintering operation.

* * * * *